United States Patent [19]

Ishimoto

[11] Patent Number: 4,682,048
[45] Date of Patent: Jul. 21, 1987

[54] OUTPUT CIRCUIT WITH IMPROVED TIMING CONTROL CIRCUIT

[75] Inventor: Shoji Ishimoto, Tokyo, Japan

[73] Assignee: NEC Corporation, Tokyo, Japan

[21] Appl. No.: 673,454

[22] Filed: Nov. 21, 1984

[30] Foreign Application Priority Data

Nov. 21, 1983 [JP] Japan ............................. 58-219016

[51] Int. Cl.⁴ ...................... H03K 5/13; H03K 5/159; H03K 17/28; G11C 8/00
[52] U.S. Cl. .................................. 307/269; 307/595; 307/602; 307/594; 307/605; 365/233
[58] Field of Search ............... 307/269, 590, 592, 593, 307/594, 595, 597, 603, 605, 606, 279, 272 R, 582, 573, 265, 247 R, 273; 365/190, 194, 195, 189, 205, 230, 233

[56] References Cited

U.S. PATENT DOCUMENTS

| 4,061,933 | 12/1977 | Schroeder et al. | 307/269 |
| 4,322,825 | 3/1982 | Nagami | 365/203 |
| 4,390,797 | 6/1983 | Ishimoto | 307/264 |
| 4,443,714 | 4/1984 | Nakano et al. | 307/269 |

Primary Examiner—Stanley D. Miller
Assistant Examiner—Trong Quang Phan
Attorney, Agent, or Firm—Sughrue, Mion, Zinn, Macpeak & Seas

[57] ABSTRACT

A memory output circuit which can ensure that sufficient width of output data even in the case of high speed memory operation. The output circuit comprises an output section, a driver circuit for controlling the output section in response to a control signal, and a delay circuit adapted to reset the driver circuit when a predetermined time has elapsed from the enabling of the output section.

9 Claims, 12 Drawing Figures

OUTPUT CIRCUIT WITH IMPROVED TIMING CONTROL CIRCUIT

BACKGROUND OF THE INVENTION

The present invention relates to an output circuit, and particularly to a control circuit therefore.

Recently, semiconductor circuit devices utilizing LSI techniques have been improved so that they can be fabricated with high density and, simultaneously, can be capable of operating faster. For example, MOS dynamic random-access memories, which are typical of such devices, have progressed to where 265k-bit memories are now commercially available, and simultaneously, access time has improved from 150 ns to 120 ns to 100 ns. When a semiconductor device is utilized in the design of an apparatus or system, the efficiency of the system is often determined by the device which has a rapid access time and cycle time. For example, a memory can be made to execute a large number of processes, such as reading, writing, and so on, within a certain time by accelerating its cycle time. The cost per bit of a memory has been reduced, so that recently there has been a rapid increase in the use of memories in image processing. In this case, the memory must have a cycle time corresponding to the dot rate of a CRT in a display apparatus. In a memory used for this purpose, the important points are the data rate for reading and writing, and the effective width of the read-out data, rather than the access time.

In determining the data rate and the effective width of read-out data, an output circuit and a timing control circuit for controlling the output circuit have important roles. Namely, the timing control circuit controls the output operation and reset operation of the output circuit in response to a basic control signal. More particularly, the timing control circuit generates an activation signal a first predetermined delay time after the basic control signal becomes active. The active level of the basic control signal starts the output operation. The output circuit starts its output operation in response to the activation signal. Then, a second predetermined delay time after the basic control signal changes to an inactive level, the timing control circuit generates a reset signal to reset the output circuit.

Accordingly, the effective width of the output data corresponds to the period between the start of the activation signal and the reset signal. These signals are in turn dependent upon the activation period of the control signal, and thus upon the frequency of the control signal. The detailed feature of the above control technique is disclosed in U.S. Pat. Nos. 4,390,797 and 4,322,825.

However, if the repetition rate of the basic control signal becomes too fast, it becomes difficult to keep the effective width of the output data at a desired value. Namely, the width of the output data becomes remarkably short when the repetition rate is fast. Also, certain fluctuations must be considered in the characteristics of the control circuit.

Accordingly, it has been difficult to keep the effective width of the output data at the desired value for a high speed operation.

Thus, since the output data width is directly dependent upon the frequency of the basic control signal (strobe) in the memory circuit, an increased strobe frequency could reduce the output data width to a duration which is too short for subsequent application circuitry.

SUMMARY OF THE INVENTION

It is an object of the present invention to provide an output circuit which can ensure a sufficient effective data output width and is suitable for a high-speed operation.

The output circuit according to the present invention is of the type having an output section for generating an output signal and a timing control section for controlling the operation in response to a basic control signal. The control section enables the output section when a certain delay time has passed from the time point that the basic control signal is changed from the inactive to the active level and maintains the enabled state of the output section for a predetermined period irrespective of the state of the basic control signal. After the predetermined period has elapsed, the control section resets the output section. Thus the end point of the predetermined period is determined before the occurrence of a subsequent active level of the basic control signal.

According to the present invention, the above predetermined period itself directly defines the effective width of the output data independently from the change of the basic control signal from the active level to the inactive level. As a result, it is possible to realize an output circuit which stably ensures the effective data width when the cycle rate is increased.

DETAILED DESCRIPTION OF THE INVENTION

In the following description, N-channel MOS transistors (hereinafter referred to as MOSTs) are employed by way of example and a high level is assumed as a logic 1 level while a low level is assumed as a logic 0 level.

Figure 1:
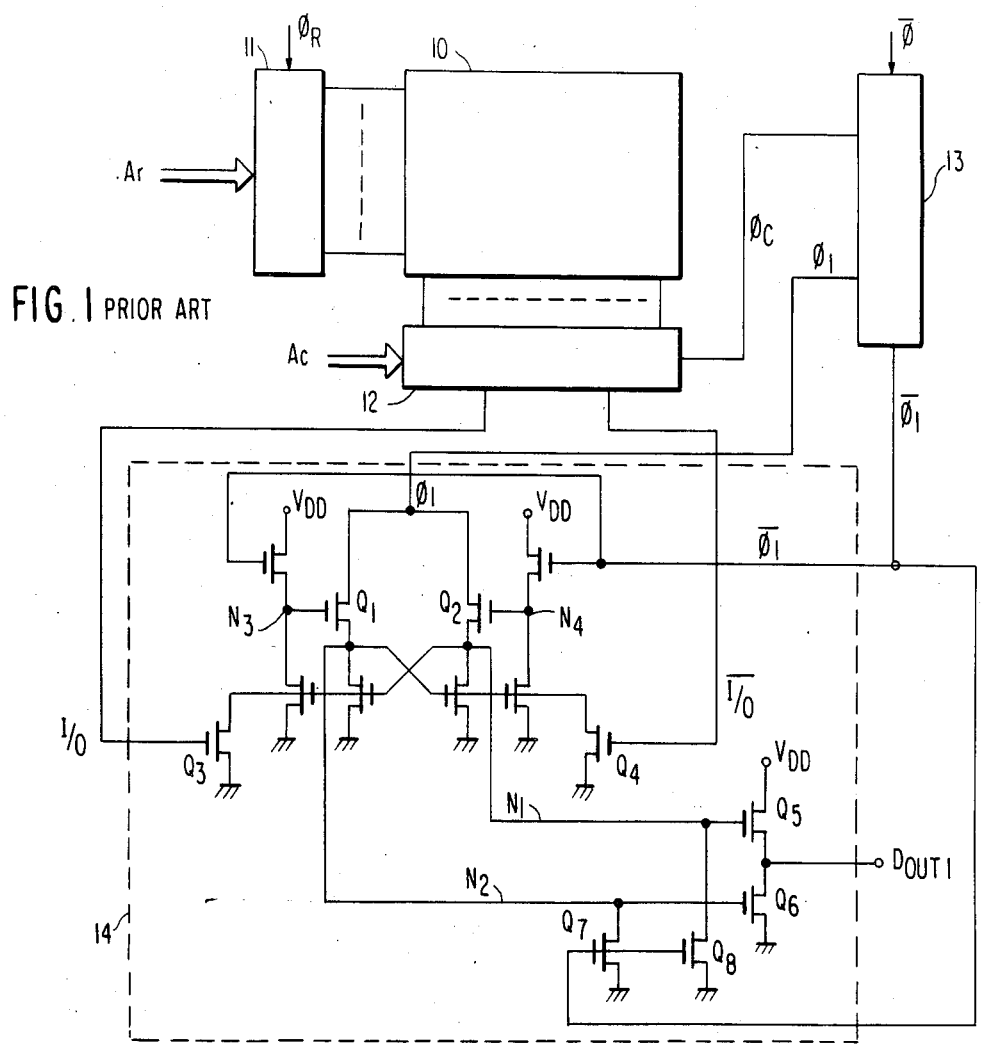
FIG. 1 is a circuit diagram of a memory having an output circuit according to the prior art.

FIG. 1 shows a memory including a memory cell array 10, a row selection circuit 11, a column selection circuit 12, an output circuit 14 and a control circuit 13 for the output circuit 14.

The row selection circuit 11 receives a group of row address signals $A_r$ and selects one of the rows of the array in response to a row strobe signal $\phi_R$. The column selection circuit 12 receives a group of column address signals $A_c$ to select one of the columns of the array in response to a timing signal $\phi_c$ which is generated from the control circuit 13 receiving a column basic signal $\bar{\phi}$. The control circuit 13 also generates an activation signal $\phi_1$ and a reset signal $\bar{\phi}_1$ for the output circuit 14 in response to $\bar{\phi}$.

First, the signal $\phi_R$ is made high in level so that the row selection circuit 11 selects one of the rows. After read-out signals appear on the respective columns and $\bar{\phi}$ becomes low, the column selection circuit 12 selects one of the columns to connect it with a pair of bus lines I/O and $\overline{I/O}$. Then, $\bar{\phi}_1$ is changed to a low level while $\phi_1$ becomes high so that the output circuit 14 is enabled to output read-out data at a terminal $D_{out1}$.

The above is the general description of the whole operation.

Figure 2:
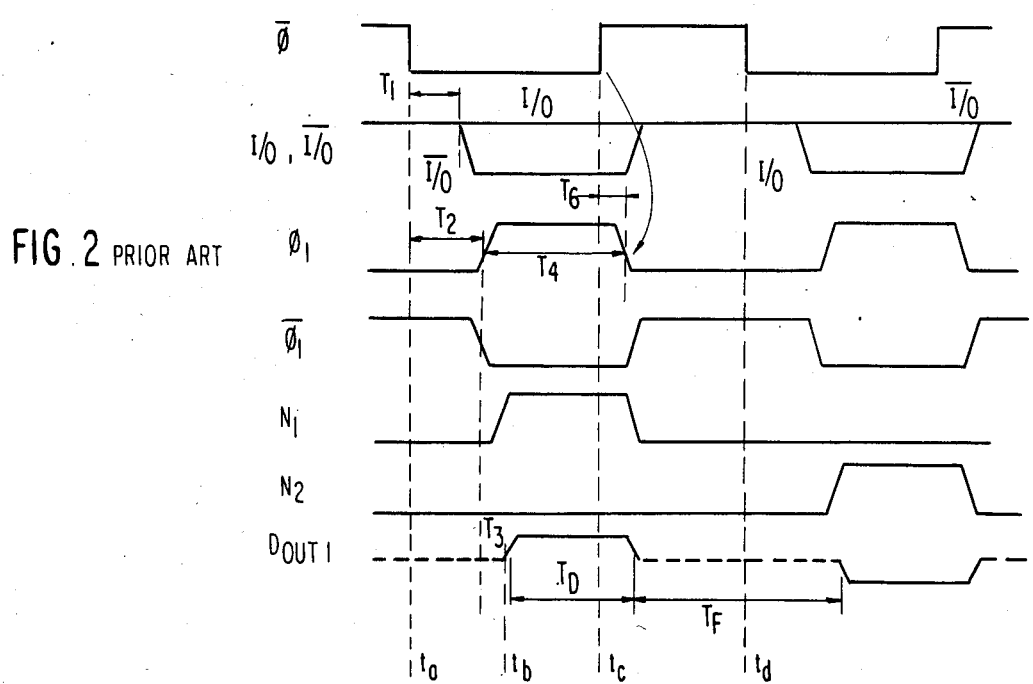
FIG. 2 is an operational timing chart of the output circuit of FIG. 1.

Next, with reference to FIG. 2, the operation of the output circuit 14 will be described in more detail.

At a time point $t_a$, $\bar{\phi}$ is changed from a high level to a low level. In response to this change, the signal $\phi_c$ is made high (not shown) to enable the column selection circuit 12. After a certain operation time $T_1$ has elapsed, true and complementary read-out signals appear on the pair of bus lines I/O and $\overline{I/O}$ connected to gates of input MOSTs $Q_3$ and $Q_4$. After a period $T_2$ has elapsed ($T_2 > T_1$), the signal $\bar{\phi}_1$ becomes low while the signal $\phi_1$ becomes high so that the output circuit 14 becomes active. In response to this, mutually complementary signals appear on nodes $N_1$ and $N_2$ which are applied to gates of MOSTs $Q_5$ and $Q_6$. Therefore, read-out data $D_{out1}$ is generated at $t_b$ after a slight delay time $T_3$. Here, a time period from the fall of $\bar{\phi}$ to the determination of the level of $D_{out1}$, i.e., $T_2 + T_3$, corresponds to the access time in general.

At a time point $t_c$, $\bar{\phi}$ returns to the high level for introducing a reset period to the memory. When predetermined delay time $T_6$ has elapsed, the control circuit 13 changes the signal $\phi_1$ to a low level and the signal $\bar{\phi}_1$ to a high level. In response to $\bar{\phi}_1$, MOSTs $Q_7$ and $Q_8$ become conductive to make MOSTs $Q_5$ and $Q_6$ nonconducting while the gates of MOSTs $Q_1$ and $Q_2$ are charged by a power voltage $V_{DD}$. The MOSTs $Q_5$ and $Q_6$ form a known push-pull circuit. The voltage at $D_{out1}$ will be in a floating state, and the memory enters into a reset period $T_F$. Here, the output data $D_{out1}$ is effective during a period $T_D$ which corresponds to the effective data-output width. As is clear from the drawing, the width $T_D$ is defined by the time from the determination of $D_{out1}$ to when $D_{out1}$ assumes a floating state. Here, the delay time $T_6$ is determined in such a manner that the time point $t_c$ is located before a time point $t_d$ when $\bar{\phi}$ takes the low level subsequently.

Figure 3:
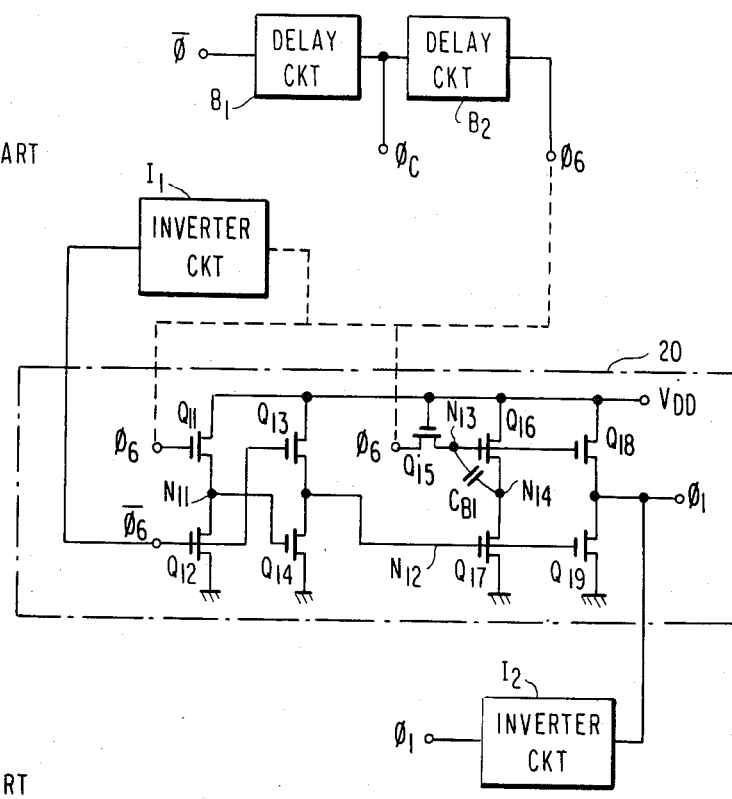
FIG. 3 is a circuit diagram of a control circuit for the output circuit according to the prior art.
Figure 4:
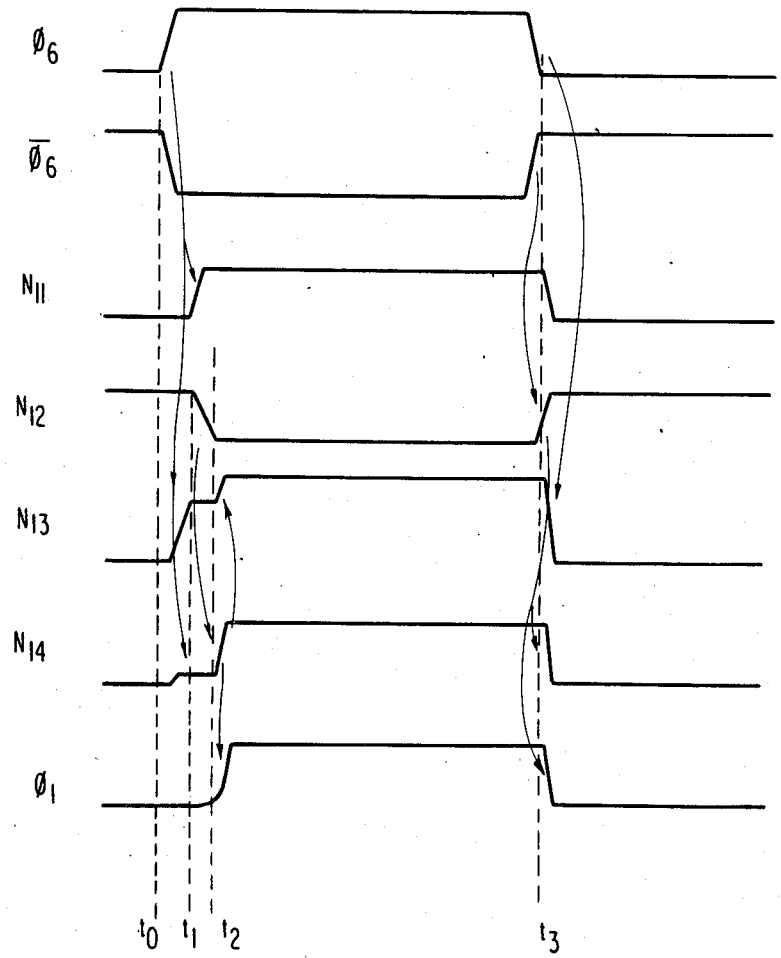
FIG. 4 is an operational timing chart of the control circuit of FIG. 3.

An example of the control circuit 13 for generating the signals $\phi_1$ and $\bar{\phi}_1$ is indicated in FIG. 3, with the timing chart shown in FIG. 4. The control circuit 13 includes delay circuits $B_1$ and $B_2$ connected in cascade, inverters $I_1$ and $I_2$ and a driver circuit 20 which has different response or delay time between the case where the output $\phi_1$ is changed from a low level to a high level and the case where the output $\phi_1$ is changed from a high level to a low level.

The operation of the circuit of FIG. 3 is illustrated in FIG. 4.

The signal $\phi_6$ rises at a time $t_0$ and the node $N_{11}$ is charged to $(V_{DD} - V_T)$ where $V_{DD}$ is the supply voltage and $V_T$ the source-drain voltage of the MOST $Q_{11}$. As a result, a MOST $Q_{14}$ is turned on, and the level 1 of a node $N_{12}$ starts to discharge (at a time $t_1$). The delay time of the delay unit consisting of the MOSTs $Q_{11}$ to $Q_{14}$ is adjusted so that the discharge of node $N_{12}$ starts when a node $N_{13}$ is charged to nearly $V_{DD} - V_T$ by a MOST $Q_{15}$. When the level of node $N_{12}$ reaches a 0 level at a time $t_2$, MOSTs $Q_{17}$ and $Q_{19}$ are turned off and the level of a node $N_{14}$ is charged to a 1 level by a MOST $Q_{16}$. Simultaneously, the node 13 is charged to above $V_{DD}$ by means of a bootstrap effect of a capacitor $C_{B1}$, so that the level of the output driving signal $\phi_1$ is raised up to $V_{DD}$, and thus completes its change of level to a 1 level.

Next, at a time $t_3$, the signal $\phi_6$ drops and the signal $\bar{\phi}_6$ rises, so that the node $N_{13}$ is discharged through the MOST $Q_{15}$ and the node $N_{11}$ is discharged by the MOST $Q_{12}$, and when both have reached a 0 level, the node $N_{12}$ is charged to a voltage of $V_{DD} - V_T$ by the MOST $Q_{13}$. Consequently, the levels of the node $N_{14}$ and the signal $\phi_1$ are changed to a 0 level.

In other words, the signal $\phi_1$ generated by the circuit 20 can be changed according to changes in the basic signal $\bar{\phi}$, as shown in FIG. 4.

Because the conventional control circuit 13 has the above construction, when the cycle time (the cycle period of the signal $\bar{\phi}$) is reduced so as to increase the quantity of data obtained within a certain time, the effective width $T_D$ of the output data is reduced together with the cycle time, because the effective width $T_D$ of the output data depends upon the width during which the signal $\bar{\phi}$ is active, that is, when its level is 0. This means that reducing the cycle time also reduces the effective width $T_D$ of the output data.

Figure 5:
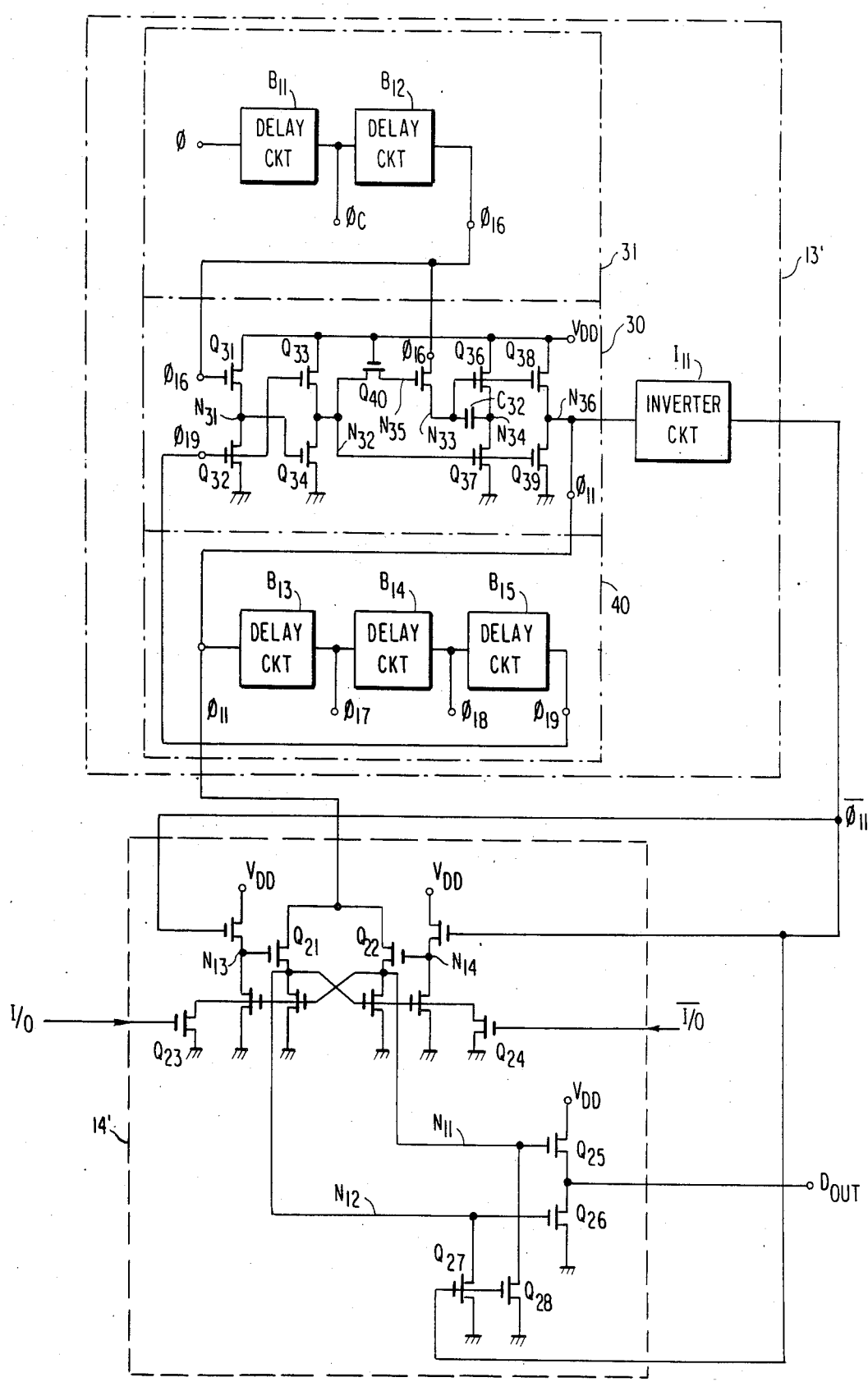
FIG. 5 is a circuit diagram of the output circuit with the control circuit according to the present invention.

With reference to FIG. 5, an embodiment of the present invention will be described.

In FIG. 5, an output circuit 14' has a similar circuit structure to that of circuit 14 of FIG. 1 and only the control circuit 13' has a different structure from that of circuit 13 of FIG. 1.

In the circuit 13', an internal control signal generation circuit 31 is composed of delay circuits $B_{11}$ and $B_{12}$ which generate control signals of $\phi_c$ and $\phi_{16}$ which lag predetermined delay times behind $\bar{\phi}$, in the same way as in the prior art. A reset control signal generation circuit 40 is composed of delay circuits $B_{13}$, $B_{14}$ and $B_{15}$ and generates a reset control signal $\phi_{19}$ which lags a predetermined delay time with respect to a timing signal $\phi_{11}$. A driver circuit 30 generates the timing signal $\phi_{11}$ in response to the signal $\phi_{16}$ and the reset control signal $\phi_{19}$. An inverter circuit $I_{11}$ generates a precharge signal $\bar{\phi}_{11}$ in response to the signal $\phi_{11}$.

The driver circuit 30 includes a delay section consisting of MOSTs $Q_{31}$ to $Q_{34}$ and a bootstrap type buffer section composed of MOSTs $Q_{36}$ to $Q_{40}$ and a capacitor $C_{32}$. The signal $\phi_{16}$ serves as a set input to the driver circuit 30 thereby to make the output signal $\phi_{11}$ of the circuit 30 high in level while the signal $\phi_{19}$ from delay circuit $B_{15}$ acts as a reset input to the circuit for making the signal $\phi_{11}$ low in level. Therefore, a gate of MOST $Q_{31}$ and a drain of MOST $Q_{35}$ serve as a set input of the circuit 30 while a gate of MOST $Q_{32}$ serves as a reset input terminal of the circuit 30.

In this structure, in place of the signals $\phi_1$ and $\bar{\phi}_1$ of FIG. 1, the signals $\phi_{11}$ and $\bar{\phi}_{11}$ are employed for controlling the output circuit 14'. In the control circuit 13' the reset signal generator circuit 40 is provided for resetting the driver circuit 30.

Figure 6:
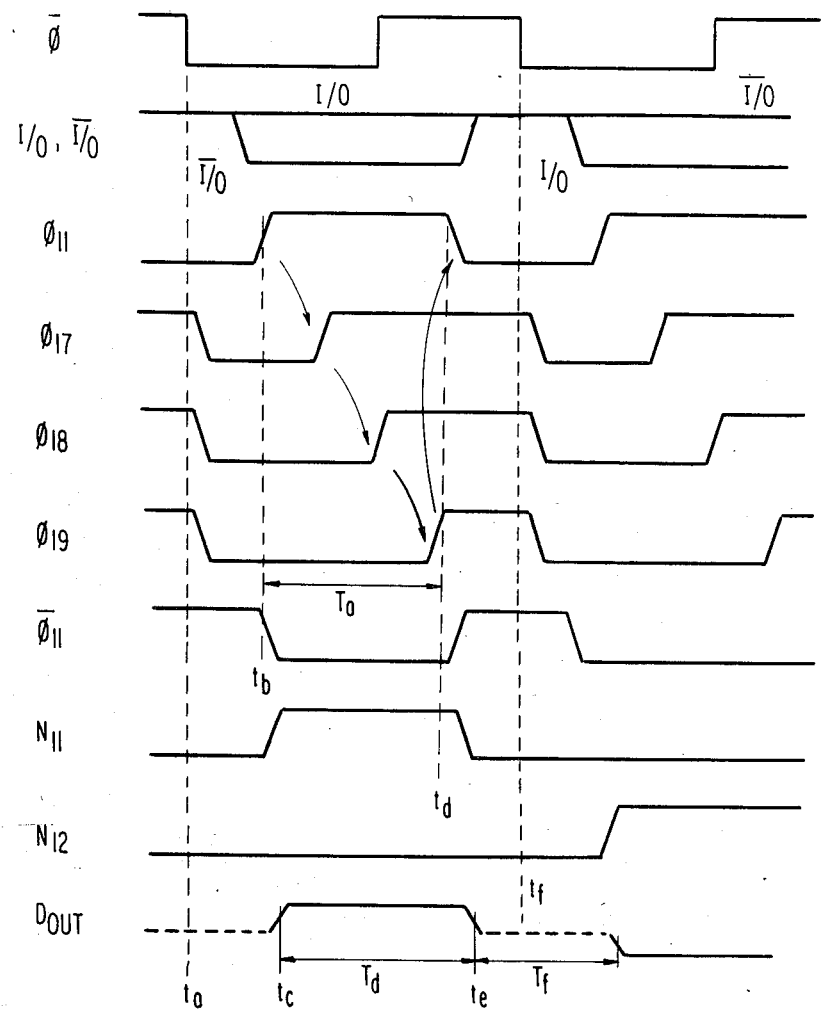
FIG. 6 is an operational timing chart of the control circuit of FIG. 5.

Operation of the circuit of FIG. 5 will be described with reference to FIG. 6.

First, the signal $\bar{\phi}$ becomes low at a time point $t_a$. In response to this change, the signal $\phi_c$ is energized so that true and complementary read-out signals are generated on the bus lines I/O and $\overline{I/O}$ after the operation time of the column selection circuit. With a slight delay from the occurrence of the read-out signals (I/O, $\overline{I/O}$), the signal $\phi_{11}$ becomes high through a delay time due to the delay circuits $B_{11}$ and $B_{12}$ so that the output circuit 14' is enabled. In response to this, the levels of the nodes $N_{11}$ and $N_{12}$ are determined by MOSTs $Q_{23}$ and $Q_{24}$ so that read-out signal $D_{out11}$ appears at a time point $t_c$ through an operation time of the output circuit 14'.

Simultaneously, the signal $\phi_{11}$ is also input to the reset signal generation circuit 40 and subjected to delay processing through the delay circuits $B_{13}$, $B_{14}$ and $B_{15}$ so that the delay signals $\phi_{17}$, $\phi_{18}$ and $\phi_{19}$ are sequentially generated. At a time point $t_d$, the signal $\phi_{19}$ becomes high so that the driver circuit 30 is reset to change $\phi_{11}$ to a low level. The time period $T_a$ from $t_b$ to $t_d$ is defined by the entire delay time due to the delay circuits $B_{13}$, $B_{14}$ and $B_{15}$ and it determines the duration during which $\phi_{11}$ is at a high level. It is obvious that the high level period $T_a$ of $\phi_{11}$ directly corresponds to the effective data-out width $T_D$ of the output circuit 14'. In response to the fall of $\phi_{11}$, caused by the rise of $\phi_{19}$, MOSTs $Q_{25}$ and $Q_{26}$ are made nonconducting by MOSTs $Q_{27}$ and $Q_{28}$ so that the output $D_{out}$ is brought into a floating state, i.e., reset period $T_F$ at a time point $t_e$. Here, the time point $t_e$ is established before the subsequent active level of $\overline{\phi}$ at a time point $t_f$.

In the operation described above, after $t_b$, any change in the level of the signal $\overline{\phi}$ from 0 to 1 does not affect the holding of the level of the output signal $\phi_{11}$ at 1, as described above, and this signal cannot be changed from 1 to 0 until the level of $\phi_{19}$ rises to the 1 level. This raises, the control signal $\overline{\phi_{11}}$ and changes the level of nodes $N_{11}$ and $N_{12}$ to 0 through MOSTs $Q_{27}$ and $Q_{28}$, to provide the floating state.

This means that, in this embodiment, as soon as the level of the output data $D_{out}$ is determined and the access time ends, $\phi_{19}$ is activated a predetermined time after the signal $\phi_{11}$ by delay circuits $B_{13}$, $B_{14}$ and $B_{15}$, and the driving signal $\phi_{11}$ is reset by the reset control signal $\phi_{19}$. Thus, the effective width $T_D$ of the output data $D_{out}$ determined by the fall of the driving signal depends only on the time $T_a$ between the driving signal $\phi_{11}$ and the reset control signal $\phi_{19}$, and does not depend on the cycle time of the external control signal $\phi$ or its low level width. This means that, during this time, the output data $D_{out}$ has no relationship with the rise of the external control signal $\overline{\phi}$.

In the above description, among the signals $\phi_{17}$ to $\phi_{19}$, $\phi_{19}$ is connected to the gate of MOST $Q_{32}$. However, depending upon the value desired for the period $T_a$, any of the other signals $\phi_{17}$ and $\phi_{18}$ can be used by connecting it to the gate of MOST $Q_{32}$ by a known programming technique.

Figure 7A:
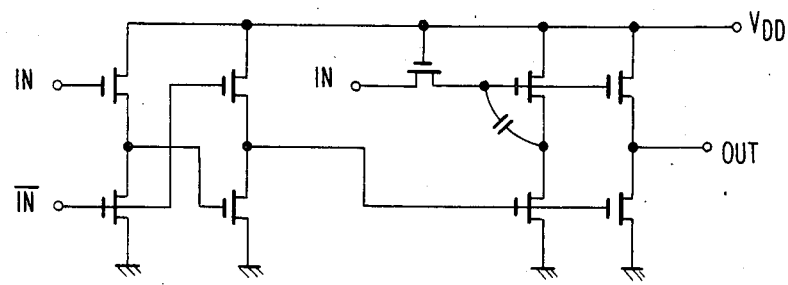
FIGS. 7A, 7B and 7C are circuit diagrams showing examples of the delay circuits used in the control circuit of FIG. 5.
Figure 7B:
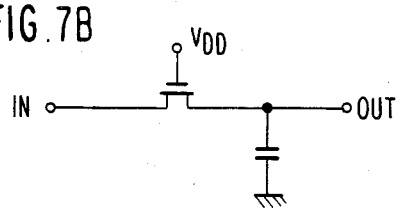
Figure 7C:
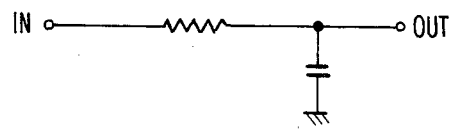

FIGS. 7A, 7B and 7C show examples of delay circuits $B_{11}$, $B_{12}$, $B_{13}$, $B_{14}$ and $B_{15}$. FIG. 7A shows a timing generation circuit utilizing the MOSTs of the conventional example of FIG. 1; FIG. 7B shows a delay circuit comprised of a single MOST and a capacitor; FIG. 7C shows a delay circuit comprised of a resistor and a capacitor. Three stages of delay circuits are shown in FIG. 5, but the number of stages can be changed as required.

Figure 8:
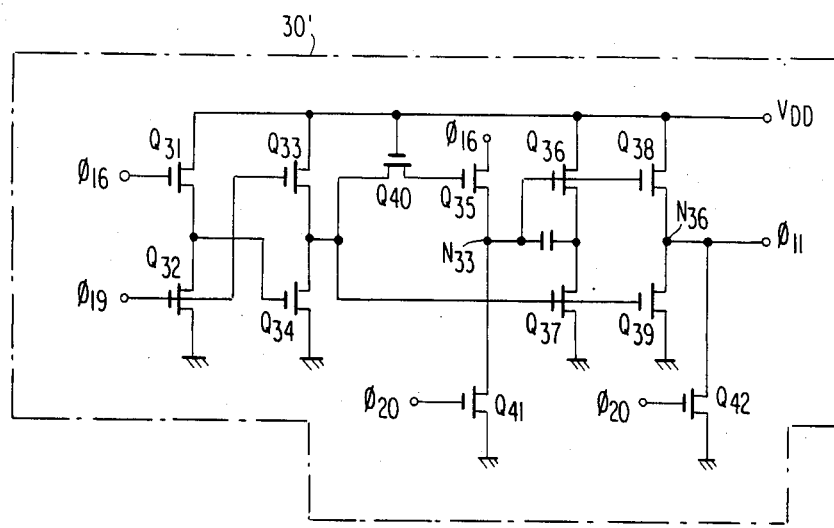
FIG. 8 is a circuit diagram showing modification of the control circuit of FIG. 5.
Figure 9:
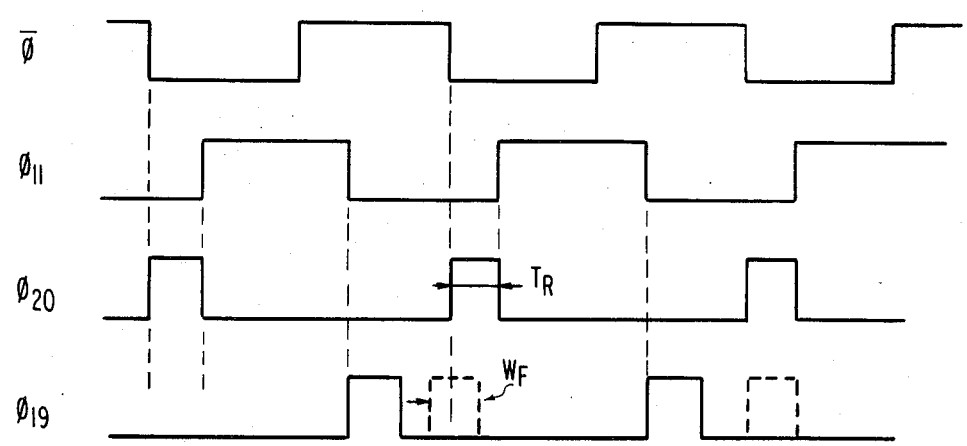
FIG. 9 is an operational timing chart of the modified embodiment of FIG. 9.
Figure 10:
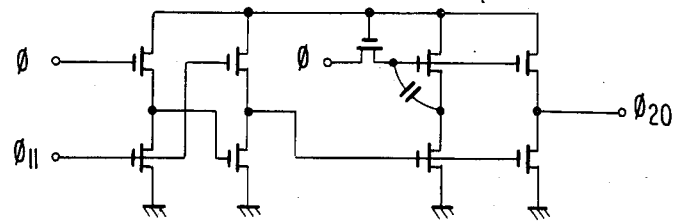
FIG. 10 is a circuit diagram showing a circuit for generating the timing signal $\phi_{20}$.

With reference to FIGS. 8 to 10, another embodiment of the invention will be explained.

This embodiment is achieved by replacing the circuit 30 of FIG. 5 with a circuit 30' of FIG. 8. The circuit 30' is structured by adding MOST $Q_{41}$ connected between the node $N_{33}$ and ground potential and MOST $Q_{42}$ connected between the node $N_{36}$ and ground potential. A one-shot timing signal $\phi_{20}$ is applied to the gates of MOSTs $Q_{41}$ and $Q_{42}$. The signal $\phi_{20}$ is generated by a generator of FIG. 10 in response to the signals $\overline{\phi}$ and $\phi_{11}$.

This embodiment ensures a stable generation of $\phi_{11}$ even when the cycle time of $\phi$ is so fast that the normal reset signal $\phi_{19}$ would not occur prior to a subsequent activation of $\phi$.

As shown in FIG. 9, the reset signal $\phi_{19}$, which occurs a fixed time after $\phi$ becomes active (a 0 level in the case of $\phi$), could occur as shown at $W_f$ if the period of $\phi$ is very rapid. Failure to reset driver circuit 30' would prevent $\phi_{11}$ from going to 0 and would clearly interfere with the operation of the output circuit. To prevent his occurrence, a pulse $\phi_{20}$ is generated by the circuit of FIG. 10 starting when $\phi$ goes active and ending when $\phi_{11}$ goes to 1. The application of $\phi_{20}$ to MOSTs $Q_{41}$ and $Q_{42}$ ensures that $\phi_{11}$ is reset. Thus upon the next occurrence of $Q_{16}$, $\phi_{11}$ will again rise to the 1 level to operate the output circuit.

I claim:

1. An output circuit comprising:
   a driver circuit having a first control terminal, a second control terminal and an output terminal, said driver circuit operatively generating a first timing signal at said output terminal during a period from a time when a first control signal is applied to said first control terminal under absence of application of a second control signal to said second control terminal to a time when said second control signal is applied to said second control terminal,
   a delay circuit having an input terminal coupled to said output terminal of said driver circuit and an output terminal coupled to said second control terminal of said driver circuit, said delay circuit generating said second control signal at the output terminal thereof when a predetermined time period has elapsed from the generation of said first timing signal, and
   an output section having an operation control terminal coupled to said output terminal of said driver circuit, a data input terminal receiving an input data signal and a data output terminal, said output section operatively generating at said data output terminal an output data signal corresponding to an input data signal applied to said data input terminal when said first timing signal is present, whereby said output data signal is generated during said predetermined period.

2. The output circuit according to claim 1, in which said output section includes a flip-flop circuit having a pair of data nodes, one of said data nodes being connected to said input data terminal, a first field effect transistor having a source-drain path coupled between a first voltage source and said data output terminal and a gate coupled to one of said pair of data nodes, and a second field effect transistor having a source-drain path coupled between said data output terminal and a second voltage source and a gate coupled to the other of said pair of data nodes.

3. The output circuit according to claim 1, further comprising means responsive to said first timing signal for generating a reset signal, and reset means responsive to said reset signal for inhibiting said output section from generating said output data signal.

4. The output circuit according to claim 1, in which said driver circuit includes a first series circuit of first and second field effect transistors, each having source-drain paths, connected in series between said first and second voltage sources, a gate of said first field effect transistor being connected to said first control terminal, a gate of said second field effect transistor being connected to said second control terminal, a second series circuit of third and fourth field effect transistors, each having source-drain paths connected in series between said first and second voltage sources, a gate of said third field effect transistor being connected to said second control terminal, a gate of said fourth field effect transistor being connected to an intermediate junction of said first series circuit, a third series circuit of fifth and sixth field effect transistors, each having source-drain paths, connected in series between said first and second voltage sources, a gate of said sixth field effect transistor being connected to an intermediate junction of said second series circuit, a seventh field effect transistor having a source-drain path coupled between said first control terminal and a gate of said fifth transistor, an eighth field effect transistor having a source-drain path coupled between a gate of said seventh transistor and the intermediate junction of said second series circuit, and a fourth series circuit of ninth and tenth field effect transistors, each having source-drain paths, coupled between said first and second voltage sources, a gate of ninth field effect transistor being connected to the gate of said fifth field effect transistor, a gate of said tenth field effect transistor being connected to the gate of said sixth field effect transistor, an intermediate junction of said fourth series circuit being connected to said output terminal of said driver circuit.

5. An output circuit comprising:
a driver circuit having a first control terminal, a second control terminal and an output terminal, said driver circuit operatively generating a first timing signal at said output terminal during a period from a time when a first control signal is applied to said first control terminal under absence of application of a second control signal to said second control terminal to a time when said second control signal is applied to said second control terminal, said driver circuit including:
a first series circuit of first and second field effect transistors, each having source-drain paths, connected in series between voltage sources, a gate of said first field effect transistor being connected to said first control terminal, a gate of said second field-effect transistor being connected to said second control terminal,
a second series circuit of third and fourth field effect transistors, each having source-drain paths, connected in series between said voltage sources, a gate of said third field effect transistor being connected to said second control terminal, a gate of said fourth field effect transistor being connected to an intermediate junction of said first series circuit,
a third series circuit of fifth and sixth field effect transistors, each having source-drain paths, connected in series between said voltage sources, a gate of said sixth field effect transistor being connected to an intermediate junction of said second series circuit,
a seventh field effect transistor having a source-drain path coupled between said first control terminal and a gate of said fifth transistor,
an eighth field effect transistor having a source-drain path coupled between a gate of said seventh transistor and the intermediate junction of said second series circuit, and
a fourth series circuit of ninth and tenth field effect transistors, each having source-drain paths, coupled between said voltage sources, a gate of said ninth field effect transistor being connected to the gate of said fifth field effect transistor, a gate of said tenth field effect transistor being connected to the gate of said sixth field effect transistor, an intermediate junction of said fourth series circuit being connected to said output terminal of said driver circuit,
a delay circuit having an input terminal coupled to said output terminal of said driver circuit and an output terminal coupled to said second input terminal of said driver circuit, said delay circuit generating said second control signal at the output terminal thereof when a predetermined time period has elapsed from the generation of said first timing signal, and
an output section having an operation control terminal coupled to said output terminal of said driver circuit, a data input terminal receiving an input data signal and a data output terminal, said output section operatively generating at said data output terminal an output data signal corresponding to an input data signal applied at said data input terminal when said first timing signal is present.

6. The output circuit according to claim 5, in which said output section includes a flip-flop circuit having a pair of data nodes, one of said data nodes being connected to said input data terminal, and a series circuit of eleventh and twelfth field effect transistors connected in series between voltage sources, gates of said eleventh and twelfth field effect transistors being connected to said data nodes, an intermediate junction being connected to said data output terminal.

7. The output circuit according to claim 5, further comprising means responsive to said first timing signal for generating a reset signal, and reset means responsive to said reset signal for inhibiting said output section from generating said output data signal.

8. In an output circuit of the type having an output section having a data input terminal, a data output terminal and a control terminal; a control section having a first terminal receiving a control signal and a second terminal for generating an enable signal, and a reset terminal, and enabling means coupled to said second terminal of said control section and said control terminal of said output section for operatively enabling said output section to generate at said data output terminal an output signal corresponding to an input signal applied to said data input terminal in response to said enable signal, the improvement comprising a delay circuit having an input end coupled to said second terminal of said control section and an output end coupled to said reset terminal of said control section, said delay circuit generating at said output end a delayed signal of an input signal applied at said input end, said control section being inhibited from generating said enable signal in response to said delayed signal.

9. The invention as claimed in claim 8, wherein said output section includes a flip-flop circuit coupled to said data input terminal and having a pair of output nodes, and a series circuit of first and second field effect transistors having source-drain paths connected in series between voltage sources, gates of said first and second field effect transistors being connected to said pair of output nodes, an intermediate junction of said series circuit being connected to said data output terminal.

* * * * *